United States Patent [19]

Mlcak et al.

[11] Patent Number: 5,338,416
[45] Date of Patent: Aug. 16, 1994

[54] ELECTROCHEMICAL ETCHING PROCESS

[75] Inventors: Richard Mlcak, Somerville; Harry L. Tuller, Wellesley, both of Mass.

[73] Assignee: Massachusetts Institute of Technology, Cambridge, Mass.

[21] Appl. No.: 14,324

[22] Filed: Feb. 5, 1993

[51] Int. Cl.$^5$ ............................. C25F 3/12; C25F 3/14
[52] U.S. Cl. ........................ 204/129.3; 204/129.65; 204/129.7; 204/129.75
[58] Field of Search ........... 204/129.3, 129.75, 129.65, 204/129.7

[56] References Cited

U.S. PATENT DOCUMENTS

| | | | |
|---|---|---|---|
| 4,303,482 | 12/1981 | Buhne et al. | 204/129.65 |
| 4,414,066 | 11/1983 | Forrest et al. | 204/129.3 |
| 4,482,443 | 11/1984 | Bacon et al. | 204/129.3 |
| 4,664,762 | 5/1987 | Hirata | 204/129.3 |
| 4,995,953 | 2/1991 | Yee | 204/129.3 |
| 4,995,954 | 2/1991 | Guilinger et al. | 204/129.75 |
| 5,021,364 | 6/1991 | Akamine et al. | 437/228 |
| 5,129,982 | 7/1992 | Wang et al. | 156/628 |
| 5,129,991 | 7/1992 | Gilton | 156/635 |
| 5,149,404 | 9/1992 | Blonder et al. | 204/129.3 X |
| 5,167,778 | 12/1992 | Kaneko et al. | 204/129.3 |

FOREIGN PATENT DOCUMENTS 61-105953  5/1986  Japan.
63-225599  9/1988  Japan.
63-267391  10/1988  Japan.

OTHER PUBLICATIONS

Kloeck, Ben et al., "Study of Electrochemical Etch-Stop for High-Precision Thickness Control of Silicon Membranes," IEEE Trans. Electron Dev. 36(4):663-669, Apr. 1989.

Levy-Clement, Claude, "Photoelectrochemical Etching of Silicon *Electrochimica Acta*", 37(5):877-888, 1992.

Yoshida, Takashi, "Photo-Induced Preferential Anodization for Fabrication of Monocrystalline Micromechanical Structures," Proceedings of the IEEE Workshop Microelectro Mechanical Systems, Travemunde, Germany pp. 56-60, Feb. 4, 1992.

Eijkel, C. J. M. et al., "A New Technology for Micromachining of Silicon: Dopant Selective HF Anodic Etching for the Realization of Low-Dopant Monocrystalline Silicon Structures," IEEE Electron Device Letters, 11(12):588-589 1990.

Branebjerg, J. et al., "Dopant Selective HF Anodic Etching of Silicon for the Realization of Low-Doped Monocrystalline Silicon Microstructures," Proceedings of the IEEE Workshop Microelectro Mechanical Systems, An Investigation of MicroStructures, Sensors, Actuators, Machines and Robots, Nara, Japan, Jan. 30, pp. 221-226.

Primary Examiner—Donald R. Valentine
Attorney, Agent, or Firm—Hamilton, Brook, Smith & Reynolds

[57] ABSTRACT

A method of photo-assisted electrochemical machining of micromechanical structures from a silicon substrate having both p and n regions in a hydrofluoric electrolyte solution is disclosed. Both p and n regions of the silicon substrate may be selectively etched, with differing regions as etch stops, at controlled rates by the appropriate choice of cell bias, p-n junction bias and illumination intensity.

22 Claims, 7 Drawing Sheets

FIG. I

ELECTROCHEMICAL ETCHING PROCESS

RELATED PUBLICATIONS

Certain details of the present invention are found in *Photo-Assisted Electrochemical Machining of Micromechanical Structures* by R. Mlcak, H. L. Tuller, P. Greiff and J. Sohn, presented at the IEEE MEMS '93 Workshop on Micro Electro Mechanical Systems, Ft. Lauderdale, Fla., Feb. 7-10, 1993.

BACKGROUND OF THE INVENTION

Many devices fabricated from silicon and other semiconductors can not be constructed from two dimensional structures, but must be truly three-dimensional. Some examples of these three-dimensional devices include micromechanical sensors and actuators, electrostatically driven micro-motors, intricate micro-tubing and valve systems. Other three-dimensional structures are optical gratings and lenses, isolation trenches, mesas and via holes.

Three-dimensional structures formed from silicon substrates having p and n type silicon regions are generally achieved by lithography and anisotropic etching processes. The structures which can be made by these processes are geometrically limited due to the finite number of <111> surfaces and the availability of wafers with different orientations. Additionally, in order to achieve the necessary etch stops in which etching of a desired silicon substrate terminates, the silicon substrate is generally highly doped. This causes mechanical stresses in the material leading to degradation of the micromechanical response of the device. Furthermore, these etching processes only allow removal of p-Si from p-n structure devices, without providing the ability to selectively etch away n-Si, limiting device complexity and processing versatility.

Accordingly, there is a need of a method for micromachining three-dimensional structures from substrates having both n and p type silicon regions in which either or both n and p type silicon can be selectively etched.

SUMMARY OF THE INVENTION

The present invention provides an electrochemical machining process which includes forming regions of n and p type silicon on a substrate. The n and p regions of the substrate are exposed to an electrochemical etchant such as hydrofluoric acid. An electrical cell bias is applied between the substrate and the etchant via a cell counter electrode by an external power source. The p-n junction bias between the n and p regions is also controlled by either shorting or by applying an external power source across the p-n junction. The substrate may also be exposed to near or above-bandgap electromagnetic radiation.

By controlling the cell bias, the p-n junction bias and the electromagnetic radiation intensity, n and/or p regions can be selectively etched, and the regions of differing types of silicon may serve as etch stops. Additionally, the etch rates can be controlled by varying the cell and p-n junction biases and radiation intensity. By monitoring the cell current, the amount of silicon which is etched as well as the depth of the etch cam be monitored. Furthermore, spatial control in the etching process can be accomplished with optical masking, spatially modulated light beams, or laser writing. The present invention also allows three-dimensional structures to be micromachined with a high aspect ratio with minimal mechanical stresses because the silicon regions may be lightly doped. Furthermore, the porosity and surface finish of the etched surfaces may be controlled over wide limits by control of cell and p-n junction biases and illumination intensity and wavelength.

BRIEF DESCRIPTION OF THE DRAWINGS

The foregoing and other objects, features and advantages of the invention will be apparent from the following more particular description of the preferred embodiment of the drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
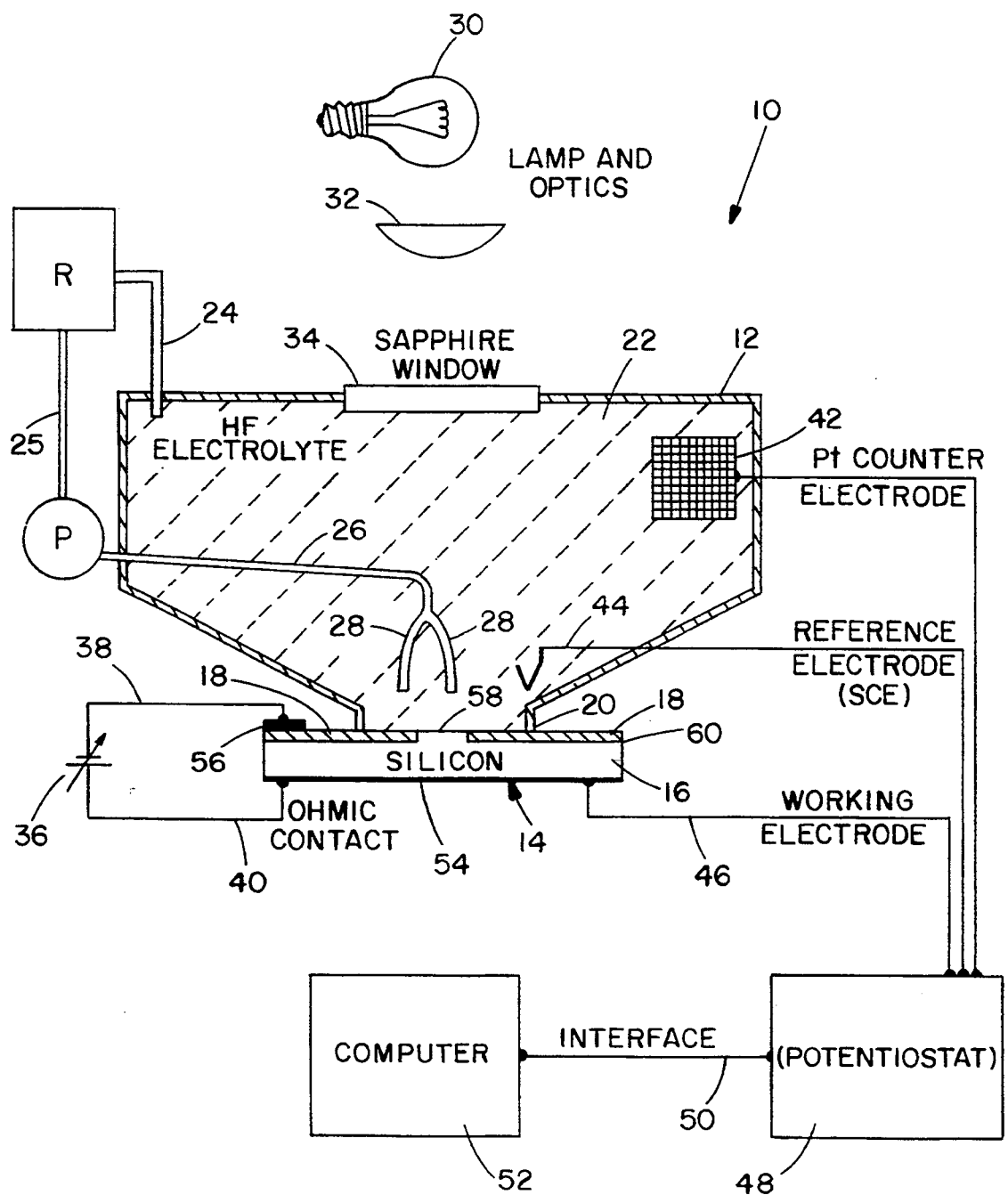
FIG. 1 is a top schematic view of the photo-assisted electrochemical machining cell.

The photo-assisted electrochemical machining of p and n regions of a silicon wafer is conducted by photo-assisted electrochemical etching apparatus 10 depicted in FIG. 1. Apparatus 10 includes a teflon cell 12 containing a 5 weight % aqueous hydrofluoric acid electrolyte solution 22. Alternatively, other aqueous hydrofluoric acid concentrations or alcohol based (ethanol, methanol, etc.) hydrofluoric acid solutions or other fluoride ion electrolytes such as $NH_4HF_2$, $NH_4F$ etc. may be used. The silicon wafer 14 which is to be etched, is pressed against teflon seal 20 exposing surface 58 to HF electrolyte 22. Silicon wafer 14 is a p-on-n structure with a layer of p type silicon 18 over a region of n type silicon 16. A circulating pump p circulates HF electrolyte 22 between cell 12 and reservoir "R" by pumping HF electrolyte 22 through intake pipe 24 into reservoir "R" and returning HF electrolyte 22 to cell 12 via return pipes 25 and 26. Two tubes 28 are connected to pipe 26 and direct the returning HF electrolyte 22 onto surface 58 of wafer 14. The circulating HF electrolyte 22 removes bubbles evolving on surface 58 during etching. In one example, reservoir "R" has a volume of 1 liter and pump "P" is a variable controlled pump with a flow integrator. Additionally, the HF electrolyte 22 is a 5% HF solution at room temperature. Furthermore, the inner diameter of tubes 28 is ⅛ inch. Alternatively, the volume of reservoir "R", the concentration of HF electrolyte 22 and the inner diameter of tubes 28 can be varied. In addition, pump "P" can have a fixed flow rate.

Lamp 30 provides variable intensities of white light to cell 12. Light from lamp 30 is focused by condenser 32 through sapphire window 34 and HF electrolyte 22 onto wafer 14. Lamp 30 is a 1 kilowatt quartz tungsten halogen lamp and condenser 32 is a F/0.7 Aspherab borosilicate crown condenser. Alternatively, lamp 30 and condenser 32 can be of other comparable components. Further a monochrometer may be placed between the lamp and cell to provide controlled wavelength illumination. Alternatively, a laser may be used for this purpose. While some etching may occur with wavelengths corresponding to sub-bandgap illumination, preferred wavelengths are those corresponding to values with photon energies greater than the semiconductor bandgap. Improved aspect ratios can be expected at shorted wavelengths.

A variable power source 36 controls the voltage or bias between the p silicon 18 and n silicon 16 across the p-n junction 60. Lead 40 electrically connects ohmic contact 54 on the n region 16 to power source 36. Lead 38 electrically connects ohmic contact 56 on p type region 18 to power source 36 thereby completing an electrical circuit through the p-n junction and power source 36. Leads 38 and 40 are attached to contacts 40 and 56 for example with epoxy.

Potentiostat 48 provides a variable voltage or bias across the HF electrolyte 22 and wafer 14 interface 58 and monitors the etching current. Platinum counter electrode 42 is immersed in HF electrolyte 22 and electrically connects potentiostat 48 to HF electrolyte 22 to monitor and supply etching current. Working electrode 46 is electrically connected to contact 54 of wafer 14 and electrically connects wafer 14 to potentiostat 48 thereby completing an electrical circuit through wafer 14, HF electrolyte 22, counter electrode 42 and potentiostat 48. In the preferred embodiment, electrode 42 is a 15 $cm^2$ platinum mesh counter electrode. Standard Calomel Electrode (SCE) reference electrode 44 is immersed in electrolyte 22 near surface 58. Electrode 44 provides a reference from which the potential drop or bias across the wafer 14 and electrolyte 22 interface 58 can be measured.

The voltage and current between HF electrolyte 22 and wafer 14 is provided by potentiostat 48 and is controlled by computer 52 through interface 50. In the preferred embodiment, computer 52 is an IBM AT computer and interface 50 is IEEE 488 interface. Alternatively, computer 52 and interface 50 can be of other compatible hardware.

Figure 2:
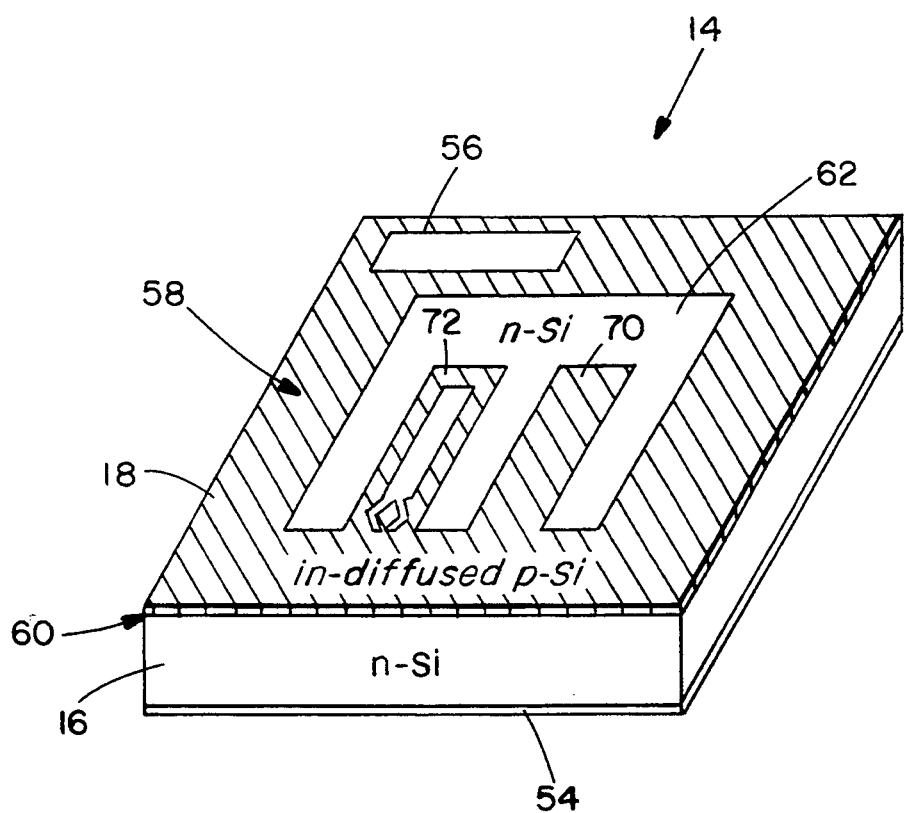
FIG. 2 is a perspective view of a silicon wafer prepared for photo-assisted electrochemical etching.

Referring to FIG. 2, wafer 14 is prepared for etching by in-diffusing boron into an n type silicon substrate through an oxide mask, thus forming a pattern 62 of a p type silicon layer 18 over n type silicon 16. FIG. 2 depicts a pattern 62 for etching two cantilever beams 72 and 70. This is for illustration purposes only since patterns for many different structures are possible. Contact 54 is formed on the backside of wafer 14 backside by a $n^+$ phosphorous in-diffusion followed by a 0.1 $\mu$m titanium-tungsten alloy and 0.2 $\mu$m gold depositions. Contact 56 is formed by applying gallium on to the p-layer 18. In one example, boron in-diffusion is performed with a surface concentration of $5 \times 10^{19}$ $cm^{-3}$ resulting in a 3.3 $\mu$m layer of p type silicon layer 18 over the n type silicon 16. Lower doping of $10^{15}$ to $10^{18}$ may be preferred.

The etching process in the MF electrolyte solution 22 (FIG. 1) is controlled by the bias across the electrolyte and wafer interface 58, the illumination provided by lamp 30 and the voltage bias across p-n junction 60 to selectively etch the p and n regions of wafer 14. The application of a sufficient bias across HF electrolyte 22 and wafer 14 will drive reduction/oxidation reactions at electrode 42 and wafer 14 in which wafer 14 is electrochemically etched by an oxidation reaction. When a positive bias is applied to wafer 14, the junction between the n region 16 in wafer 14 and HF electrolyte 22 is reverse biased, which upon illumination drives photogenerated holes to the junction. When a positive bias is applied to wafer 14, the junction between the p region 18 in wafer 14 and HF electrolyte is forward biased, driving holes to the junction. The holes destabilize the surface silicon atoms on wafer 14 which participate in an oxidation reaction that consumes silicon. The reaction products are then dissolved by HF electrolyte 22. By controlling the voltage bias and illumination intensity across the p-n junction 60, p type silicon and n type silicon can be etched either independently of each other, with the other serving as an etch stop, or together. The selective etching characteristics of n and p type silicon in apparatus 10 are discussed below.

Figure 3:
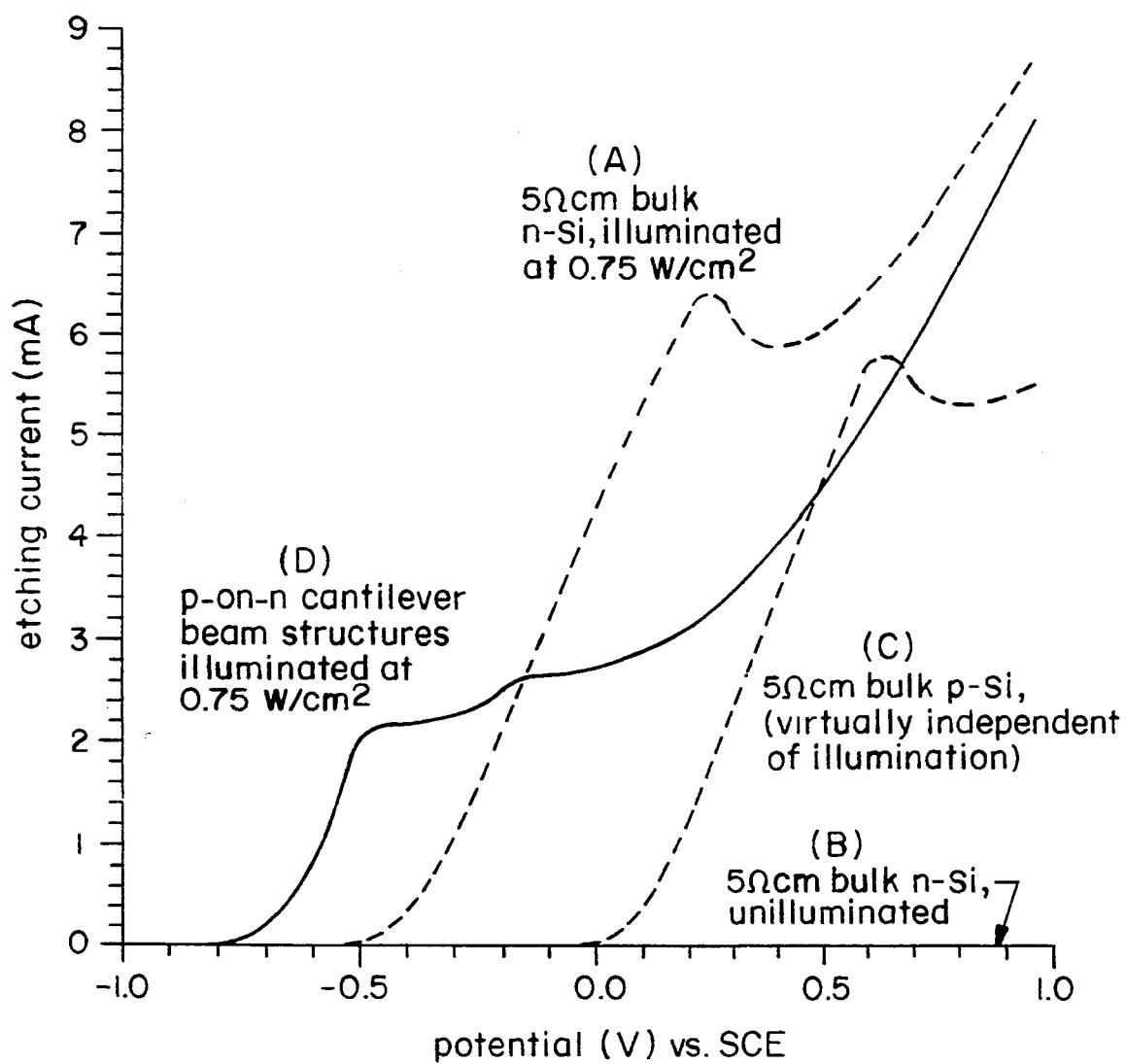
FIG. 3 is a graph of the photoelectrochemical cell current and voltage characteristics for an p-on-n cantilever beam structure, bulk p type silicon and bulk n type silicon.

FIG. 3 compares etching characteristics of 5 $\Omega$-cm p type silicon to that of 5 $\Omega$-cm n type silicon in the dark and under illumination. Curves A, B and C are for bulk silicon of either n or p type, that is, without a p-n junction 60 as would result in the structure of FIG. 2. The etching current is directly indicative of the etching rate. Curves "A" and "B" show that an illuminated region on n type silicon can be selectively etched at biases more anodic than −0.5 volts (SCE) while the unilluminated region of the n type silicon remains unetched at all biases below breakdown of the semiconductor electrolyte junction which depends on the donor doping level. Curve "C" shows that p type silicon etches at more anodic biases above 0.0 volts (SCE) regardless of illumination.

Figure 4:
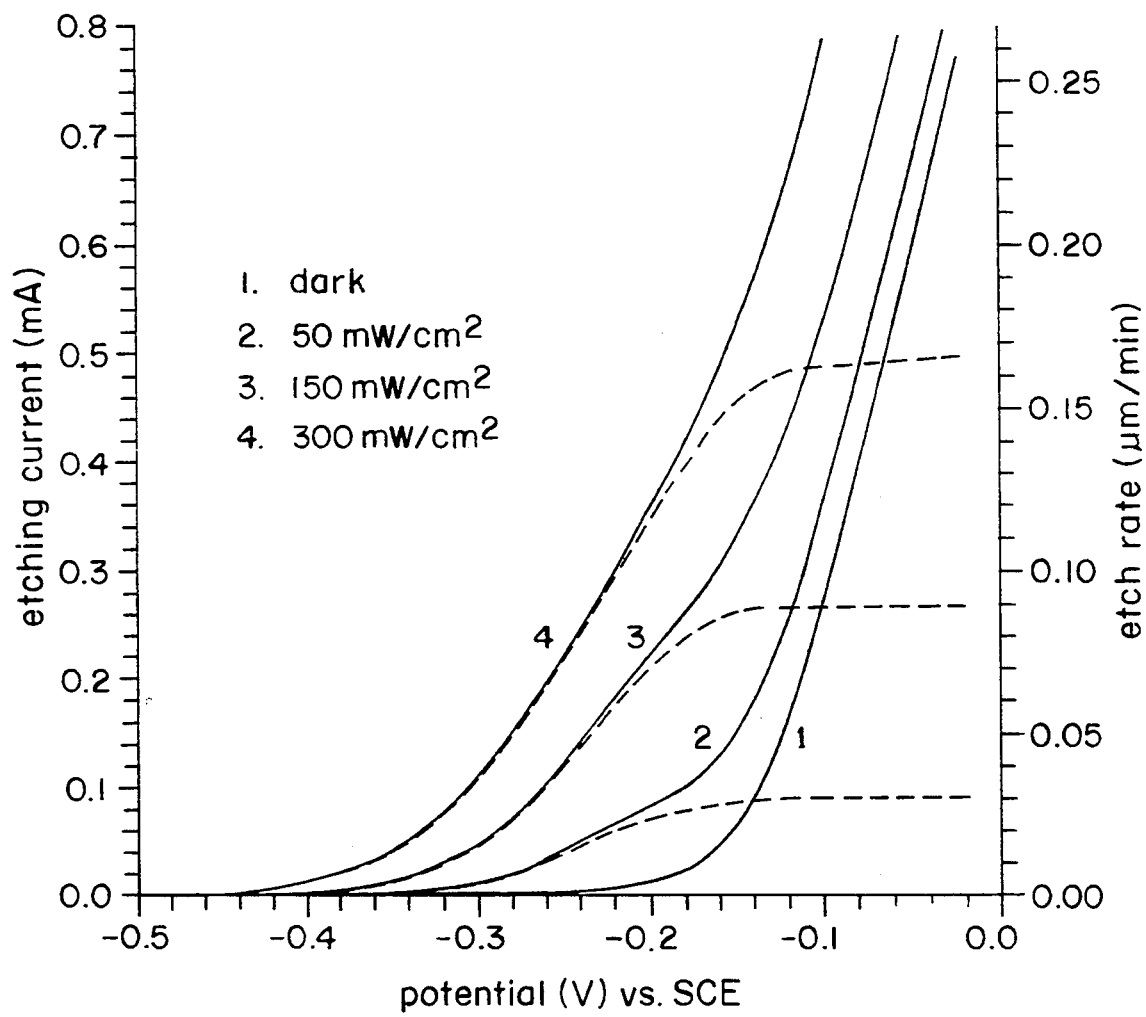
FIG. 4 is a graph showing etch rate versus voltage potential for n type silicon at various illumination intensities in 5% hydrofluoric electrolyte.

FIG. 4 shows the etching rates of n type silicon versus voltage potential for various light intensities. Notice that an increase in light intensity causes an increase in etch rate. At lower light intensities, the etching rate reaches a plateau even under an increased voltage. An increase in light intensity increases the level of photo excited electrons and holes in the n type silicon, allowing holes to be driven towards the n type silicon-electrolyte interface, thus increasing the etching rate.

Referring back to FIG. 3, curve "D" shows the current-voltage characteristics for an illuminated cantilever beam structure on wafer 14 with p-n junctions (FIG. 1). The illuminated p-n junction 60 induces a photo bias which biases the p type silicon layer 18 anodic with respect to the n type silicon 16. With illumination of 0.75 W/$cm^2$, the onset of etching is shifted −0.8 volts (SCE) by the photo bias in curve "D". P type silicon will etch between −0.8 and −0.5 volts (SCE) while n type silicon will not etch. At about −0.5 volts (SCE), n type silicon begins to etch at a low rate while p type silicon continues to etch. The n type silicon etch rate then increases with more anodic bias. The shift in the onset of p type etching caused by the photo bias ranges between −0.8 and 0.0 volts (SCE) depending on the light intensity. A higher light intensity results in a higher shift.

Although p type silicon can be selectively etched over n type silicon with a photo bias between voltages of −0.8 volts and −0.5 volts, porous etching of p type silicon results in this voltage range leaving regions of porous p type silicon. This porous p type silicon must then be removed in an additional step such as chemically etching in KOH or another chemical silicon etchant. Alternatively the porous silicon can be oxidized (for example in wet oxygen at 1,000° C. for 1 hour) to form $SiO_2$ which is readily removed by a chemical HF etch. The morphology of the porous p type silicon (e.g., pore size and density) can be controlled with HF concentration, light intensity and etching bias to achieve the microstructure most easily removed by the additional step.

In order to selectively etch n silicon over the p silicon the bias of the p silicon must be maintained cathodic of −0.5 volts (SCE). To that end, the photo bias is compensated by applying a voltage across p-n junction 60 (FIG. 1) with power supply 36.

Figure 5:
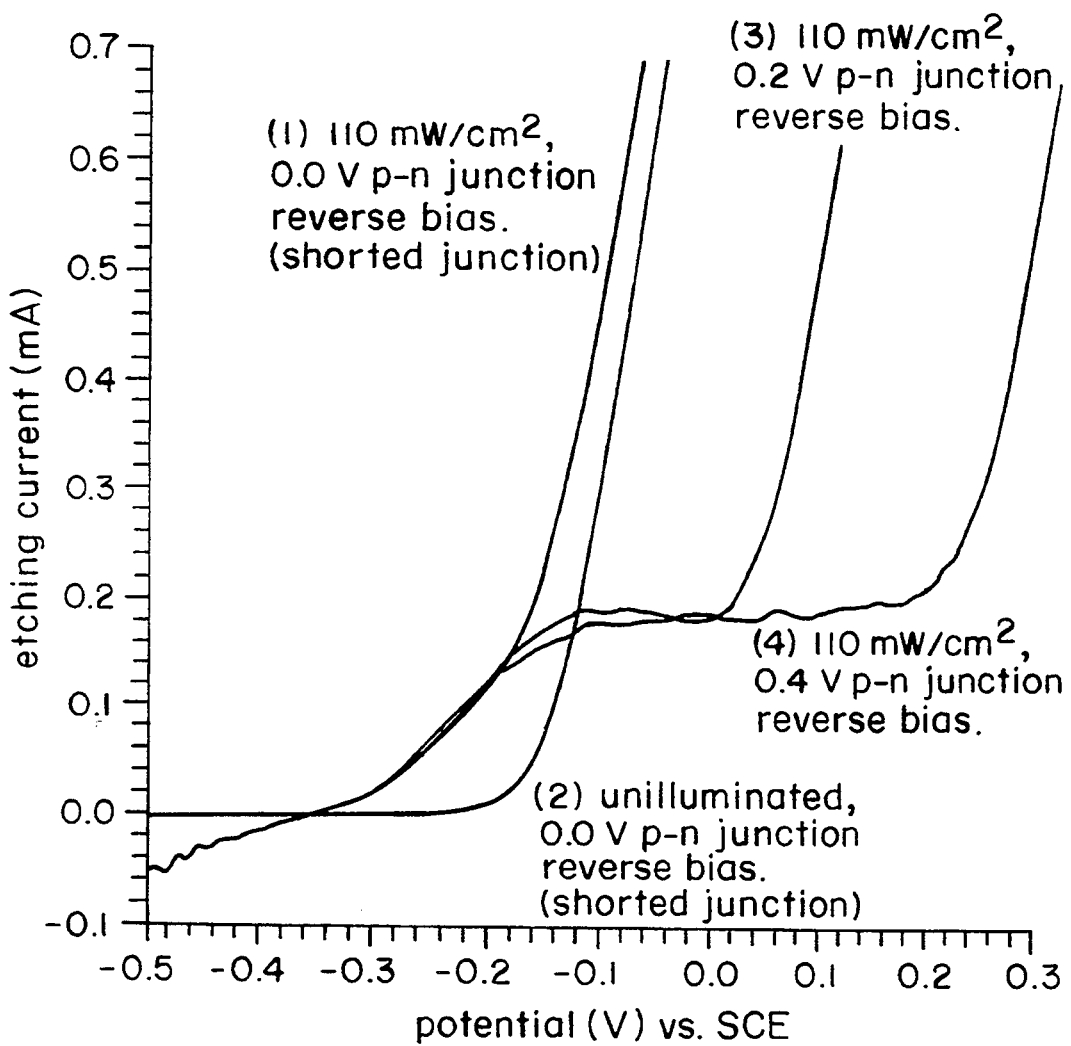
FIG. 5 is a graph showing current-voltage characteristics of an illuminated p-on-n cantilever beam structure with the p-n junction shorted.

FIG. 5 shows the current-voltage characteristics of illuminated p-on-n cantilever beam structures with the p-n junction shorted or set at 0.0 volts. The dashed curves show etching current and etch rates of n-type silicon only and the solid lines illustrate combined etch rate of both p and n material. Curve 1 shows the current-voltage characteristics of the structure while unilluminated, in which only p type silicon etches. Curve 2 shows the current-voltage characteristics while illuminated at an intensity of 50 $mW/cm^2$. Curve 3 shows the current-voltage characteristics at a light intensity of 150 $mW/cm^2$. Curve 4 shows the current-voltage characteristics at a light intensity of 300 $mW/cm^2$. The higher the light intensity, the larger the n type silicon etch rate while the p type silicon etch rate remains constant.

Figure 6:
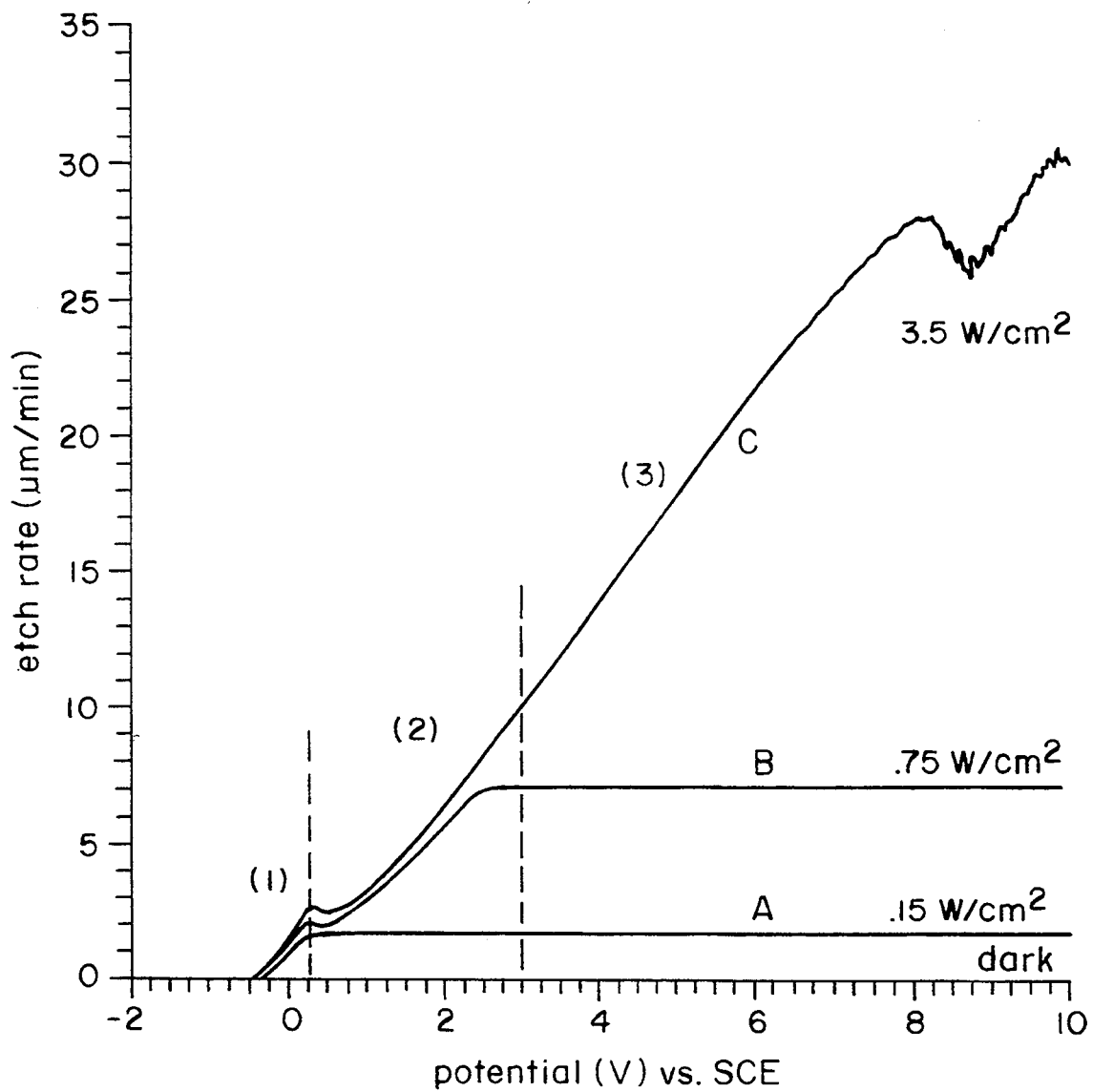
FIG. 6 is a graph showing current and voltage characteristics for a p-on-n cantilever beam structure showing the effect of a reverse bias across the p-n junction.

FIG. 6 shows the current-voltage characteristics of a cantilever beam specimen (such as cantilever beam 70) as a function of applied bias across the p-n junction 60 (FIG. 1) when illuminated. Zero volts reverse bias across the junction is equivalent to short circuiting the photo bias. The plots illustrate the combined etching rate of both p and n type silicon. Without illumination, as illustrated by curve 2, (which corresponds to curve 1 of FIG. 5), the n type silicon can be expected to perform as unilluminated bulk n type silicon, while the shorted p type silicon can be expected to perform as bulk p type silicon as illustrated at "B" and "A" in FIG. 3. Thus, curve 2 of FIG. 6 represents etching of just the p type silicon. With the zero p-n junction bias maintained and the wafer illuminated with 110 $mW/cm^2$, the etching current which is the combination of both p and n type etching current is as presented in curve 1 of FIG. 6. This curve can be seen as the addition of curve 2 for etching of p type silicon with a curve like that in FIG. 4 at "A" for n type silicon. Photo bias affects are no longer evident because they are eliminated by the shorted p-n junction. It should be noted that the small differences observed between bulk n and p type etching characteristics and the n and p type etching characteristics of the p-n junction device are due to the fact that the doping densities of the n and p regions in the p-n junction device are not 5 Ω-cm as is the case for the bulk n and p silicon to which they are compared.

The cell bias for the onset of etching p type silicon shifts from −0.8 volts (curve "D" in FIG. 3) to −0.2 volts (SEC) when short circuited as shown in curve 1 of FIG. 6. A bias window from −0.35 volts to −0.2 volts (SCE) is now achieved in which illuminated n type silicon may be selectively etched over p type silicon. As the reverse bias is increased the onset of p type silicon etching is shifted to increasing by higher anodic biases and the window for selective etching of n type silicon is enlarged as illustrated by curves 3 and 4. Curve 3 shows the etching of n type silicon under illumination with a 0.2 volt p-n junction reverse bias. Curve 4 shows the etching of n type silicon while illuminated and under a 0.4 volt p-n junction reverse bias.

Curve 2 shows that the etching of p type silicon is negligible when it is at a bias cathodic of −0.25 volts (SCE) with a 0.0 volt p-n junction reverse bias. In order to etch the n type silicon at a bias of 0.0 volts (SCE) and not etch the p type silicon, a minimum reverse bias of 0.25 volts must be applied to the p-n junction to maintain the p type silicon bias at or below −0.25 volts (SCE) (approximately curve 3 of FIG. 6). Similarly, etching n type silicon at 1.0 volts (SCE) requires a 1.25 reverse bias across the p-n junction to prevent p type silicon etching and to maintain −0.25 volt (SCE) at the p silicon. That curve would be like curve 4 but shifted well to the right of FIG. 6.

It is preferable to etch silicon at higher voltage levels because the surface finish of the etched silicon becomes smoother and the etching rate is increased. Etching rates in excess of 30 μm/min are possible. Etching at lower voltage levels results in porous etching which leaves behind porous silicon which needs to be removed in an additional etching step. The porous silicon is extremely reactive due to its higher surface area and may be removed by a 5 second dip in a silicon chemical etchant such as 16:3:1 $HNO_3:H_3COOH:HF$ or a 30 second dip in 25% KOH at 25° C. Etching at voltages in region 1 of FIG. 4 results in porous silicon which has a porous rough surface finish.

Surfaces etched at voltages in region 2 in FIG. 4 are transitional and are smoother with increasing bias. Surfaces etched at high illumination intensities (e.g., curve "C") and voltages in region 3 of FIG. 4 result in a smooth electro polished finish. This provides the opportunity to achieve the type of morphology desired in a given device.

From the above, it can be seen that selective etching of p type silicon and not n type silicon, or of the n type silicon and not p type silicon, or of both type materials can be controlled by photo bias, applied p-n junction bias and applied cell bias. Specifically, by applying photo bias and no p-n junction bias p type etching onset can be reduced to −0.8 volts (SCE) while the n type etching is retained at near −0.5 volts (SCE) as depicted by curve "D" in FIG. 3. Therefore, between −0.8 volts and −0.5 volts (SCE) p type silicon can be selectively etched without etching of the n type silicon. However, by forcing the cell bias further anodic, both materials can be etched. Under illumination, the p type onset voltage can be shifted toward that of the n type etching by applying a reverse p-n junction bias. As a result, both materials may be caused to etch simultaneously. By further increasing the p-n junction reverse bias under illumination, the p type etching onset voltage can be shifted far to the anodic while the n type onset voltage remains at less than zero volts (SCE). As a result, n type material may be selectively etched without etching the p type silicon between the two onset voltages. By forcing the p type silicon onset voltage far to the anodic, the n type silicon can alone be etched at high cell biases for most effective etching.

An advantage of this process where either n or p type silicon may be selectively etched with the other material used as a etch stop is that masking is avoided in favor of well developed n and p type region fabrication technologies. Standard semiconductor technologies such as photolithography dopant diffusion, ion implantation, etc., provide very precisely-sized and located p and n regions in the substrate both laterally and by depth, and also provide for excellent etch stops. By first outlining the microstructures using that semiconductor technology and then using the etching process of the present invention, very precise structures with steep walls and/or thin membranes can be obtained.

Figure 7:
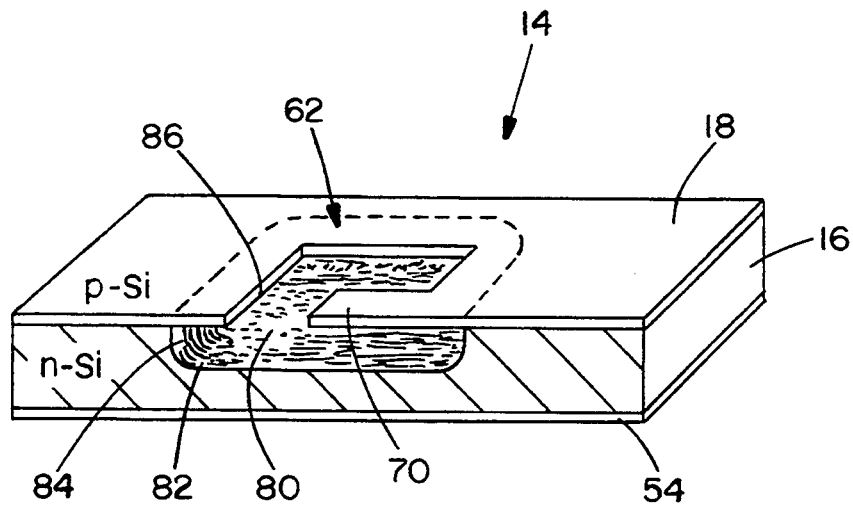
FIG. 7 is a cross-sectional view of an etched p-on-n structure showing a cantilever beam.

In FIG. 7, the n type silicon 16 of wafer 14 has been selectively etched to form a cantilever beam structure 70 made of p type silicon. Such etching would occur under illumination with a sufficient reverse bias to shift the p type onset voltage to anodic and setting cell bias below that onset voltage. N type silicon is etched from under the edges 86 of the p type layer as well as from under cantilever beam 70 so that the walls 84 of etched cavity 80 extend past the edges 86 of pattern 62 forming an undercut region 82.

Figure 8:
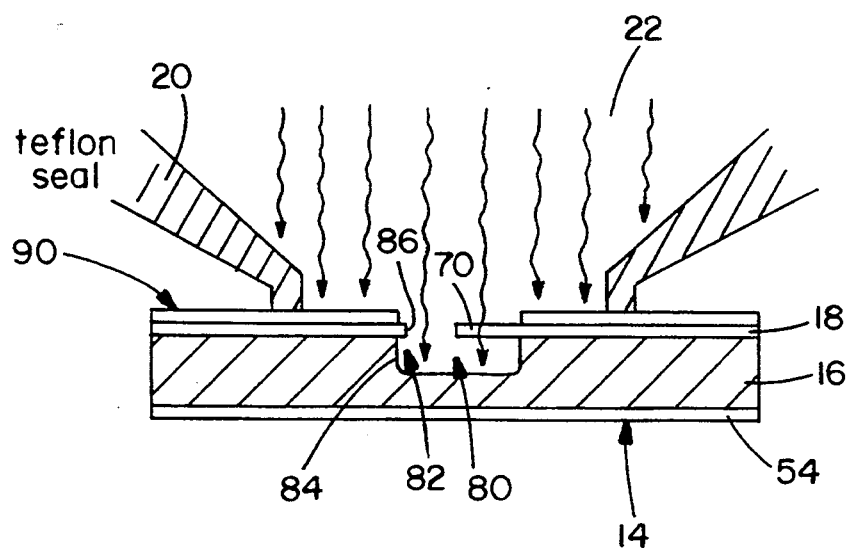
FIG. 8 is a cross-sectional view of p-on-n structure which is masked to expose only a selected region of the structure to light.

The under etching below the edges 86 of pattern 62 can be minimized by applying an optical mask 90 over the p type silicon layer as depicted in FIG. 8. In the preferred embodiment TiW is used, but other mask materials compatible with HF (or whatever electrolyte is employed for etching) may be used. The unilluminated n type material does not etch as indicated by curve "B" of FIG. 3. Mask 90 effectively prevents under etching in unwanted regions so that the walls 84 of the etched cavity do not extend substantially beyond edges 86 and there is only a small undercut region 82. After the etching of the n type silicon is completed, mask 90 can be removed by turning off lamp 30 (FIG. 1) to stop all n type etching, setting the p-n junction bias to 0.0 volt (SCE), and setting the voltage across the electrolyte 22 and wafer 14 to 0.4 volt (SCE). These conditions etch away the TiW layer before any significant p silicon etch ocurrs.

In addition to selectively etching n and p type silicon, the photo-assisted electrochemical process of the present invention can be also used to selectively etch other semiconductor materials such as germanium, GaAs, CdTe, etc. using suitable electrolytes.

A variety of electrolytes can be used. For example, for silicon, one can use HF in water (aqueous) at various concentrations, $NH_4F$, $NH_4HF_2$, and other $F^-$ containing electrolytes. Example etchants for other recommendations are as follows:

| Semicondutor | Etchant |
| --- | --- |
| GaAs | 0.2M $H_2O_2$ in 1.0 m $H_2S$ |
| InP | $HCl:HNO_3:H_2O$ = 1:1:20 |
| CdTe, CdSe | 1M $HClO_4$ or HCl |
| Ge | HF, HCl, KOH |

The forementioned cell configuration which enables the ability to: bias the p-n junction; bias the cell; and illuminate the device and p-n junction to achieve controlled selective etching of p and n regions on a p-on-n structure can also be applied to controllably selectively etch n or p regions on an n-on-p structure as is obvious to one skilled in the art. Furthermore, the invention is applicable to more complex structure which may include more than single p-n junctions.

EQUIVALENTS

While this invention has been particularly shown and described with references to preferred embodiments thereof, it will be understood by those skilled in the art that various changes and form and details may be made therein without departing from the spirit and scope of the invention as defined by the dependent claims.

The invention claimed is:

1. An electrochemical etching process comprising:
   forming n and p type regions on a semiconductor substrate;
   exposing the n and p regions of the substrate to an electrochemical etchant with an electrical cell bias applied between the substrate and etchant;
   controlling p-n junction bias between the n and p regions; and
   setting cell bias and p-n junction bias for selective electrochemical etching of the p and regions, the p and n regions capable of being selectively etched by the etchant while under an anodic bias, the anodic bias of a selected region promoting the etching of that region.

2. An electrochemical etching process as claimed in claim 1 further comprising exposing the substrate to electromagentic radiation while exposing the n and p regions to the electrochemical etchants and setting cell bias and p-n junction bias.

3. An electrochemical etching machining process comprising:
   forming n and p type regions on a semiconductor substrate;
   exposing the n and p regions of the substrate to an electrochemical etchant with an electrical cell bias applied between the substrate and etchant;
   controlling the p-n junction bias between the n and p regions;
   setting cell bias and p-n junction bias for selective electrochemical etching of the p and n regions; and
   exposing the substrate to electromagnetic radiation while exposing the n and p regions to the electrochemical etchants and setting cell bias and p-n junction bias, wherein selected regions of the substrate are exposed to different levels of the electromagnetic radiation for providing spatial selectivity in the electrochemical etching process.

4. An electrochemical etching machining process comprising:
   forming n and p type regions on a semiconductor substrate;
   exposing the n and p regions of the substrate to an electrochemical etchant with an electrical cell bias applied between the substrate and etchant;
   controlling the p-n junction bias between the n and p regions;
   setting cell bias and p-n junction bias for selective electrochemical etching of the p and n regions; and
   exposing the substrate to electromagnetic radiation while exposing the n and p regions to the electrochemical etchants and setting cell bias and p-n junction bias, wherein the electromagnetic radiation is light with photon energies near or above the bandgap of the semiconductor.

5. An electrochemical etching process as claimed in claim 1 wherein p regions are formed in n regions.

6. An electrochemical etching process as claimed in claim 5 wherein the substrate is illuminated with electromagnetic radiation and a p-n junction reverse bias of greater than zero volts is applied for selective electrochemical etching of n type regions over p type regions.

7. An electrochemical etching process as claimed in claim 6 wherein the substrate is silicon.

8. An electrochemical etching process as claimed in claim 5 wherein the substrate is silicon and a reverse p-n junction bias of greater than the cell bias plus 0.25 volts is applied.

9. An electrochemical machining process comprising:
   forming n and p type regions on a semiconductor substrate;
   exposing the n and p regions of the substrate to an electrochemical etchant with a electrical cell bias applied between the substrate and etchant, wherein the substrate is silicon and the electrochemical etchant is hydrofluoric acid electrolyte;
   controlling p-n junction bias between the n and p regions; and
   setting cell bias and p-n junction bias for selective electrochemical etching of the p and n regions.

10. An electrochemical machining process comprising:
    forming n and p type regions on a semiconductor substrate;
    exposing the n and p regions of the substrate to an electrochemical etchant with an electrical cell bias applied between the substrate and etchant;
    controlling p-n junction bias between the n and p regions;
    setting cell bias and p-n junction bias for selective electrochemical etching of the p and n regions; and
    circulating the electrochemical etchant past the semiconductor substrate.

11. An electrochemical machining process comprising:
    forming n and p type regions on a semiconductor substrate;
    exposing the n and p regions of the substrate to an electrochemical etchant with an electrical cell bias applied between the substrate and etchant;
    controlling p-n junction bias between the n and p regions;
    setting cell bias and p-n junction bias for selective electrochemical etching of the p and n regions; and
    removing regions of low density porous substrate formed during selective electrochemical etching of p and n regions.

12. An electrochemical etching process as claimed in claim 3 further comprising forming a mask over selective regions of the substrate to minimize etching below of p regions.

13. An electrochemical etching process as claimed in claim 12 further comprising:
    terminating exposure of the substrate to electromagnetic radiation; and
    increasing the electrical cell bias between the substrate and etchant to dissolve the mask.

14. An electrochemical etching process comprising:
    forming n and p type regions, including p over n regions, on a semiconductive substrate;
    exposing the n and p regions of the substrate to an electrochemical etchant with an electrical cell bias applied between the substrate and etchant;
    exposing the n and p regions of the substrate to electromagnetic illumination; and
    setting the cell bias and level of illumination such that the p over n regions are selectively electrochemically etched over the n regions.

15. An electrochemical etching process as claimed in claim 14 wherein the substrate is silicon and the cell bias is set between −0.8 volts and −0.5 volts.

16. An electrochemical etching process as claimed in claim 14 in which the electromagnetic illumination is light with photon energies greater than the bandgap of the semiconductor.

17. An electrochemical etching process as claimed in claim 14 wherein selected regions of the substrate are exposed to different levels of the electromagnetic radiation for providing spatial selectivity in the electrochemical etching process.

18. An electrochemical etching process as claimed in claim 14 further comprising circulating the electrochemical etchant past the semiconductive substrate.

19. An electrochemical etching process as claimed in claim 14 further comprising removing regions of low density porous substrate formed during selective electrochemical etching of p and n regions.

20. An electrochemical etching process as claimed in claim 17 further comprising forming a mask over selective regions of the substrate to minimize etching below of p regions.

21. An electrochemical etching process as claimed in claim 20 further comprising:
    terminating exposure of the substrate to electromagnetic illumination; and
    increasing the electrical cell bias between the substrate and etchant to dissolve the mask.

22. An electrochemical etching process comprising:
    forming n and p type regions, including p over n regions, on a semiconductor substrate;
    exposing the n and p regions of the substrate to an electrochemical etchant with an electrical cell bias applied between the substrate and etchant;
    controlling a bias across the p-n junction between the n and p regions;
    exposing the n and p regions of the substrate to electromagnetic illumination; and
    controlling the cell bias, p-n junction bias and level of illumination such that the following separate machining steps are performed with the common etchant:
    exposing the n and p regions to illumination without reverse bias of the p-n junction and with a cell bias such that p type material is selectively etched without significant etching of n type material; and
    applying sufficient illumination with a sufficient reverse bias to the p-n junction and a cell bias such that n type material is selectively etched without substantial etching of the p type material.

* * * * *

UNITED STATES PATENT AND TRADEMARK OFFICE
CERTIFICATE OF CORRECTION

PATENT NO. : 5,338,416
DATED : August 16, 1994
INVENTOR(S) : Richard Mlcak and Harry L. Tuller It is certified that error appears in the above-identified patent and that said Letters Patent is hereby corrected as shown below:

In Claim 3, column 8, line 29, after "etching," delete "machining".

In Claim 9, column 9, line 9, change "machining" to --etching--.

In Claim 10, column 9, line 22, change "machining" to --etching--.

In Claim 11, column 9, line 35, change "machining to --etching--.

Signed and Sealed this

Eighth Day of November, 1994

Attest:

BRUCE LEHMAN

Attesting Officer

Commissioner of Patents and Trademarks